US012559833B2

(12) United States Patent
Wang et al.

(10) Patent No.: US 12,559,833 B2
(45) Date of Patent: Feb. 24, 2026

(54) PVD TARGET STRUCTURE AND METHOD FOR PREPARING THE SAME

(71) Applicant: TAIWAN SEMICONDUCTOR MANUFACTURING COMPANY LTD., Hsinchu (TW)

(72) Inventors: Chia-Hsi Wang, Changhua County (TW); Yen-Yu Chen, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/489,851

(22) Filed: Oct. 19, 2023

(65) Prior Publication Data

US 2025/0129467 A1　　Apr. 24, 2025

(51) Int. Cl.
　　*H01J 37/34*　　(2006.01)
　　*C23C 14/34*　　(2006.01)
(52) U.S. Cl.
　　CPC ...... *C23C 14/3407* (2013.01); *H01J 37/3414* (2013.01); *H01J 37/3488* (2013.01)

(58) Field of Classification Search
None
See application file for complete search history.

(56) References Cited

U.S. PATENT DOCUMENTS

| | | | | |
|---|---|---|---|---|
| 2002/0079217 A1* | 6/2002 | Buehler | ................ | C23C 14/564 |
| | | | | 204/298.12 |
| 2005/0072668 A1* | 4/2005 | Kennedy | ............. | H01J 37/3423 |
| | | | | 216/65 |
| 2010/0213048 A1* | 8/2010 | Endo | ........................ | C23C 14/35 |
| | | | | 204/192.15 |
| 2015/0079336 A1* | 3/2015 | Wang | .................... | C23C 14/564 |
| | | | | 428/156 |
| 2018/0144912 A1* | 5/2018 | Murata | ............... | C23C 14/3407 |

* cited by examiner

*Primary Examiner* — Jason Berman
(74) *Attorney, Agent, or Firm* — WPAT LAW; Anthony King

(57) ABSTRACT

A PVD target structure is provided. The PVD target structure includes a target body having a first side and a second side opposite to the first side. The first side of the target body includes a first region and a second region surrounding the first region. The second region comprises a knurled profile. A method for preparing PVD target structure is also provided.

20 Claims, 13 Drawing Sheets

PVD TARGET STRUCTURE AND METHOD FOR PREPARING THE SAME

FIELD

The present disclosure relates to a physical vapor deposition (PVD) target structure, particularly, the PVD target structure includes a region having a knurled profile. The knurled profile may provide more surface and pointed structure for generating more secondary electrons in the process of PVD, and the plasma ignition issue can thus be well-handled.

BACKGROUND

PVD is a well-known process for depositing a thin film of material on a substrate and is commonly used in the fabrication of semiconductor devices. The PVD process is carried out at high vacuum in a chamber containing a substrate (e.g., wafer) and a solid source or slab of the material to be deposited on the substrate, i.e., a PVD target. In the PVD process, the PVD target is physically converted from a solid into a vapor. The vapor of the target material is transported from the PVD target to the substrate where it is condensed on the substrate as a thin film.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
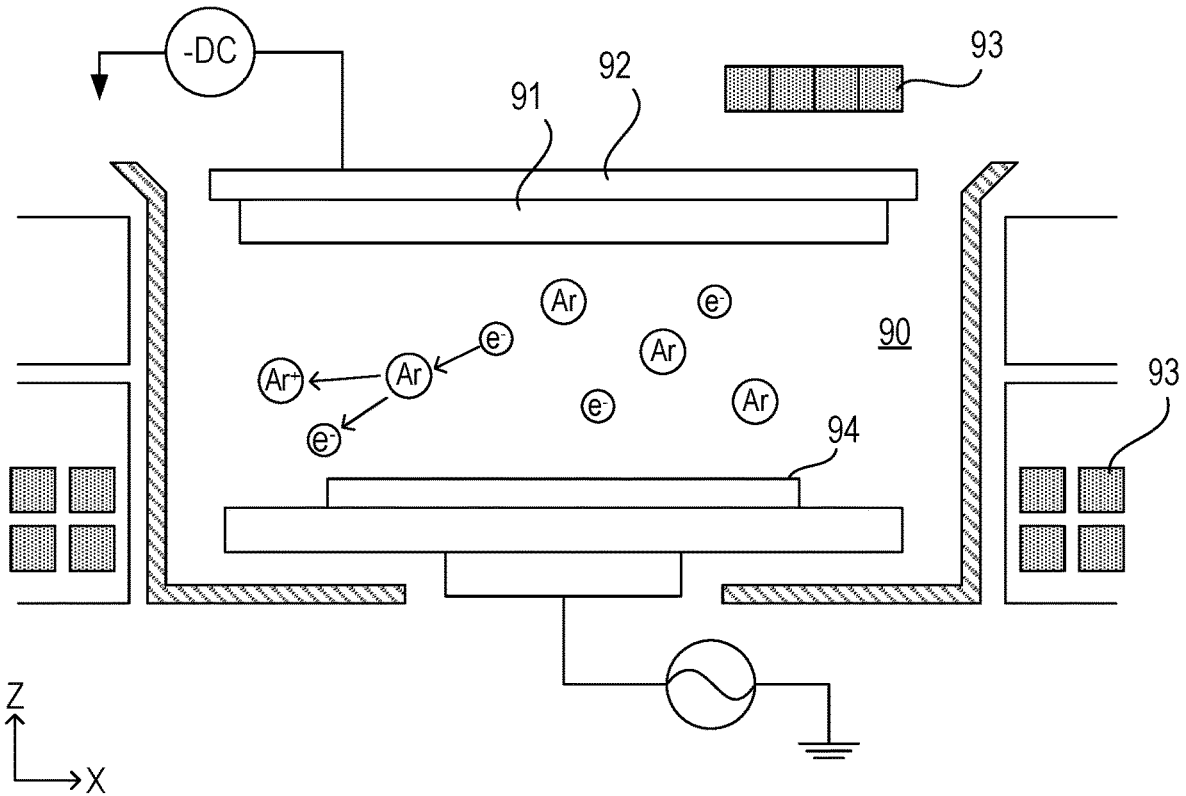
FIGS. 1A to 1C illustrate cross-sectional views of a PVD process according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer, or section from another. The terms such as "first", "second", and "third" when used herein do not imply a sequence or order unless clearly indicated by the context.

PVD is a method devoid of chemical reactions, relies on physical processes to create thin films in a gaseous state. Techniques encompass sputtering, vacuum evaporation, ion plating, and more. Among these, sputtering is a prevalent in large-scale integration (LSI) processes.

Sputtering refers to the phenomenon where high-speed atoms and ions collide with solid conductor materials, causing the ejection of atoms and molecules from said materials. The atoms and molecules expelled through sputtering adhere to substrates like wafers, thus forming a thin film thereon. This method is known as sputter deposition. In LSI processes, argon (Ar) is employed due to its efficacy in colliding with molecules. In addition to forming metal layers and insulating films, the LSI process also produces thin films of cobalt (Co), aluminum (Al), titanium (Ti), titanium nitride (TiN), and others.

The sputtering process involves placing preconfigured target materials and wafers in a low-pressure vacuum chamber and its counterpart. Argon (Ar) is introduced into the vacuum chamber, with the side of the target material acting as the cathode. Plasma is then stimulated to generate argon ions ($Ar^+$). Subsequently, the generated argon ions are directed towards the target material, leading to atom ejection from the target material. These ejected atoms may adhere to the wafer placed on the opposite side.

Compared to vacuum evaporation, sputtering has several advantages, such as it imparts higher energy (several tens of eV) to the adhering particles and results in superior adhesion to wafers. Also, even though in case of the target is made of alloy or compound materials, the composition ratio of the film formed is nearly identical to the material of the target. In addition, the target material can adhere to the conductors or insulating layers with high melting points. Moreover, as sputtering originates from the composition of the target materials, atoms and molecules arrive from various directions. In comparison to vacuum evaporation, sputtering exhibits superior step coverage in terms of deposition rate.

Figure 1B:
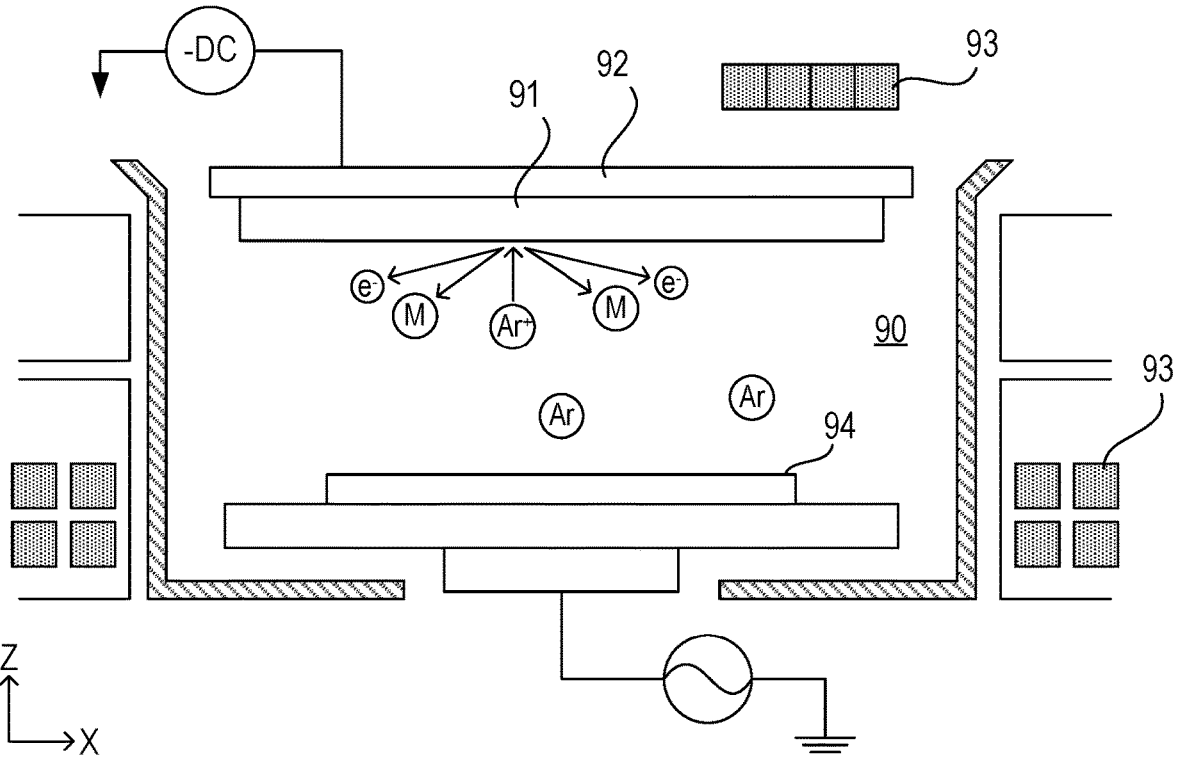
Figure 1C:
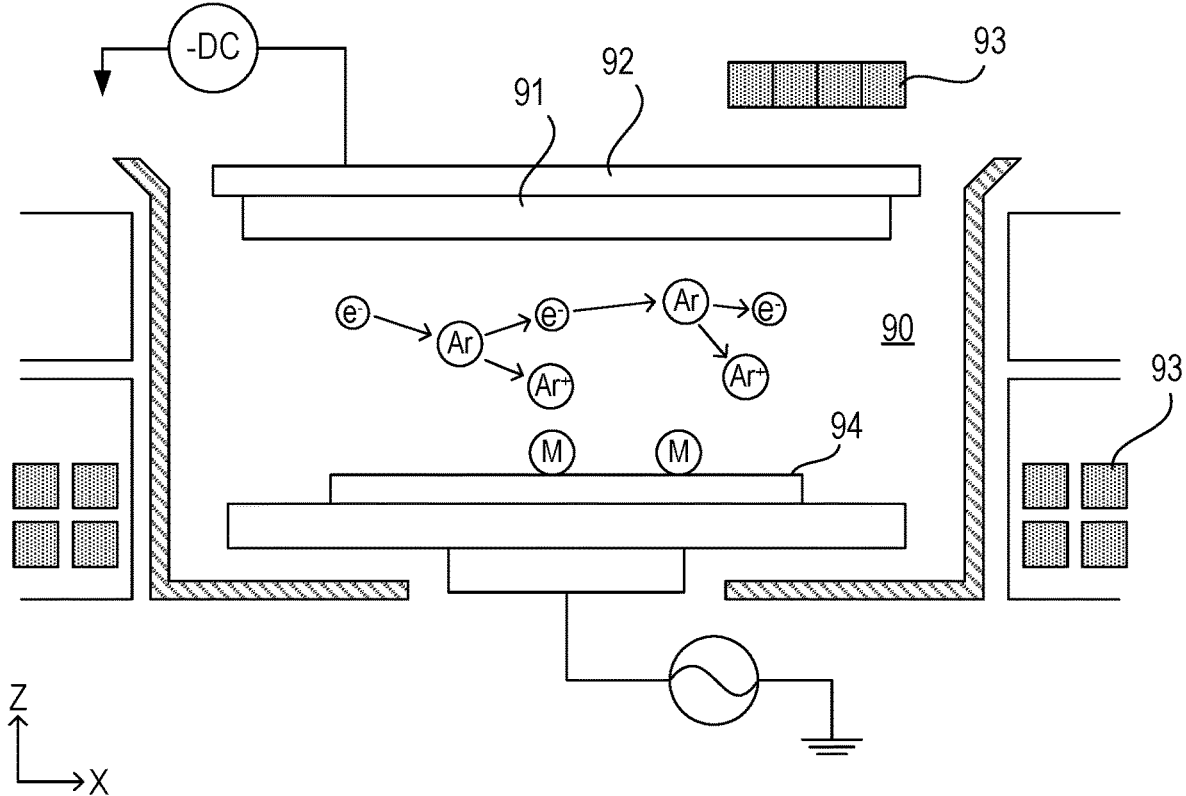

Referring to the PVD progress illustrate in FIGS. 1A to 1C, during the PVD process, in the circumstances that the electrons (e⁻) in the plasma collide with argon atoms (Ar), the argon atoms may thus transform into argon ions (Ar⁺) (see the example shown in FIG. 1A). As these argon ions collide with a target 91 disposed in a PVD chamber 90, they not only dislodge material atoms (M) from the target 91 to be deposited on a wafer 94 but also generate a substantial amount of secondary electrons (e⁻) (see the example shown in FIG. 1B). These secondary electrons (e⁻) can collide with other argon atoms (Ar), producing more argon ions (Ar⁺) and stabilizing the plasma for sputtering (see the example shown in FIG. 1C). Generally, there are some magnet arrays 93 disposed around the PVD chamber 90 for providing magnetic fields.

However, in certain practical scenarios, a quantity of the secondary electrons may be insufficient, which would prevent the overall environment of argon atom transformation to argon ions and secondary electron generation from entering a positive cycle. In such circumstances, plasma fails to achieve stability, referred to as plasma ignition failure. Typically, PVD equipment initiates a re-ignition process, and after several failed attempts, a warning is issued.

To be more detailed, there are some material which is much more difficult to ignite a reliable plasma because it is a more complex target made of different compounds. Therefore this target will be affected by grain size, impurities, and other factors from its manufacturing. Consequently, there are more ignition faults and retries than with other conventional targets using the same recipe settings. Sometimes the ignition retries and faults can be improved by implementing sequence start cleans, high pressure ignition using the sputter on shield, and/or by using a higher wattage power supply to ignite the plasma with the ion gauge on. Each method was shown to decrease the number of retries and faults and can be used on PVD systems with targets which are difficult to ignite.

The present disclosure enhances the efficiency of PVD processes by modifying the target material to increase the production of the secondary electrons. By implementing the target material structure proposed in the present disclosure, the secondary electron generation becomes ample, resulting in less ignition failures and consequently boosting the efficiency of the PVD process.

Figure 2A:
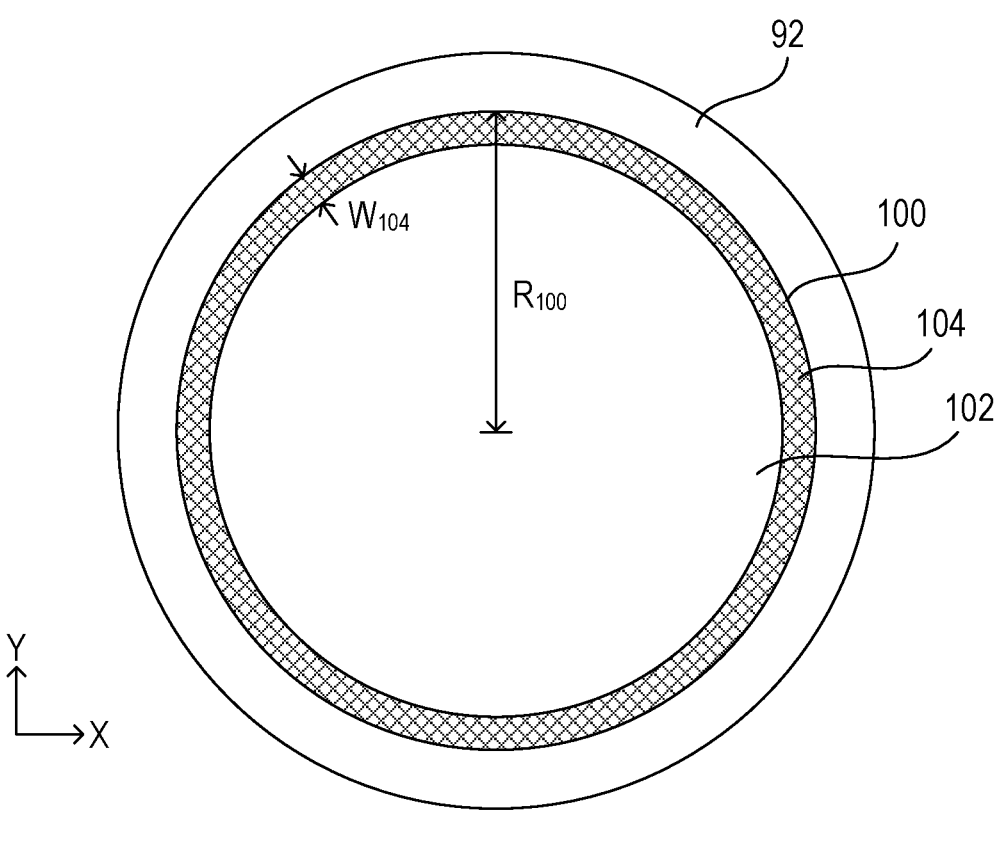
FIG. 2A illustrates a top view of a PVD target structure according to some embodiments of the present disclosure.
Figure 2B:
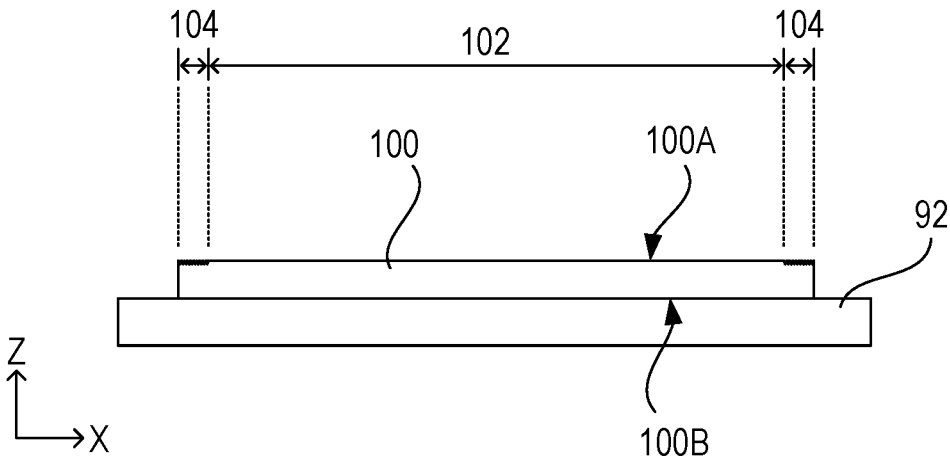
FIG. 2B illustrates a cross-sectional view of a PVD target structure according to some embodiments of the present disclosure.

Referring to FIGS. 2A and 2B, which shows a target body from a top view perspective and a cross-sectional view, respectively. In some embodiments, the target applied in PVD process is installed or assembled on a backing plate 92. The target includes a target body 100. In some embodiments, the target body 100 has a first side 100A and a second side 100B opposite to the first side 100A. The second side 100B of the target body 100 is in contact with the backing plate 92 and free from being exposed. The first side 100A of the target body 100 will face the PVD chamber 90 or the wafer 94 in the PVD process and will be used to provide the target material for sputtering.

In some embodiments of the present disclosure, the first side 100A of the target body 100 is applied by a machine work to change the profile thereof for generating more secondary electrons during the PVD process. In some embodiments, the first side 100A of the target body 100 is applied by a knurling process to form a knurled profile. The knurling process is a mechanical machining procedure that alters the surface structure of the target in a physical manner.

In the context of surface modification of the target structure, there have been comparative embodiments that the surface modification is performed by carving, sandblasting, or grinding to form a rough surface with shallow in depth. However, these examples do not correspond to the knurling process referred to in the present disclosure. The purpose of surface modification in some embodiments of the present disclosure is to enhance the generation of the secondary electrons during the PVD process. Therefore, the specific alterations in the morphology of the target are intended to create a distinctive knurled profile, with the primary aim of increasing the production of secondary electrons during the PVD process.

In some embodiments, still referring to FIGS. 2A and 2B, the first side 100A of the target body 100 includes a first region 102 and a second region 104. The first region 102 is free from being knurled and typically having a plane profile, whereas the second region 104 is physically machined to have a knurled profile. In such embodiments, a surface roughness of the first region 102 is less than a surface roughness of the second region 104.

In some embodiments, the first region 102 is encompassed by the neighboring second region 104. For some specific instances, the proximity of the second region 104 to the peripheral zone of the first side 100A of the target body 100 can be observed as represented in FIGS. 2A and 2B, where the second region 104 assumes a ring-like form.

Moreover, in some embodiments, the first region 102 is comprehensively encircled by the second region 104. Maintaining a balance, the arrangement of the second region 104 is symmetric with respect to the center of the first side 100A of the target body 100. This symmetry is essential to facilitate an even generation of additional secondary electrons emanating from the periphery of the first region 102.

Hence, it should be noted that even when the target body 100 exhibits a non-circular shape—such as a square configuration for some specific application scenarios—the integrity of the first region 102 being enclosed by the second region 104 is upheld. Accordingly, albeit with potential variations in the shape of the second region 104, which may not necessarily conform to a circular ring pattern.

The relative location of the first region 102 and the second region 104 is under the consideration that the location of the first region 102 of the target body 100 is projectively below or above the wafer or the substrate in the PVD chamber, while the first region 102 of the target body 100 is configured to provide sufficient target material to the wafer or the substrate. In addition, in some embodiments, the area of the first region 102 is greater than an area of the wafer or the substrate. In other words, the second region 104 of the target body 100 is substantially waived from the function that providing the target material to form the film on the wafer or the substrate, and therefore the area and the location of the second region 104 should not substantially reduce the original function of the target structure. Otherwise, there would be too many intrinsic target materials to be wasted in the second region 104. Accordingly, in some embodiments of the present disclosure, the second regions 104 are arranged in proximity to the edge portion of the target body 100, and while the target structure is installed in the PVD chamber, the second region 104 of the target body 100 would not projectively below or above the wafer or substrate in the PVD chamber.

In some embodiments, the width $W_{104}$ of the second region 104 is limited to approximately 10% of the radius $R_{100}$ of the target body 100. To be more detailed, it is because the dimensions of the second region 104 might wield a discernible influence on the efficacy of the PVD process. In the present disclosure, the knurled texture of the second region 104 on the first side 100A of the target body 100 is designed to amplify the generation of secondary electrons during the PVD process. In comparison, the original planar profile of the first side 100A of the target body 100 is retained exclusively in the first region 102, which serves its conventional purpose in the PVD process. Given that the central aspect of the first side 100A of the target body 100 predominantly pertains to the first region 102, the control over the width $W_{104}$ of the second region 104 is to prevent exceeding a threshold of the balance of these regions.

Figure 2C:
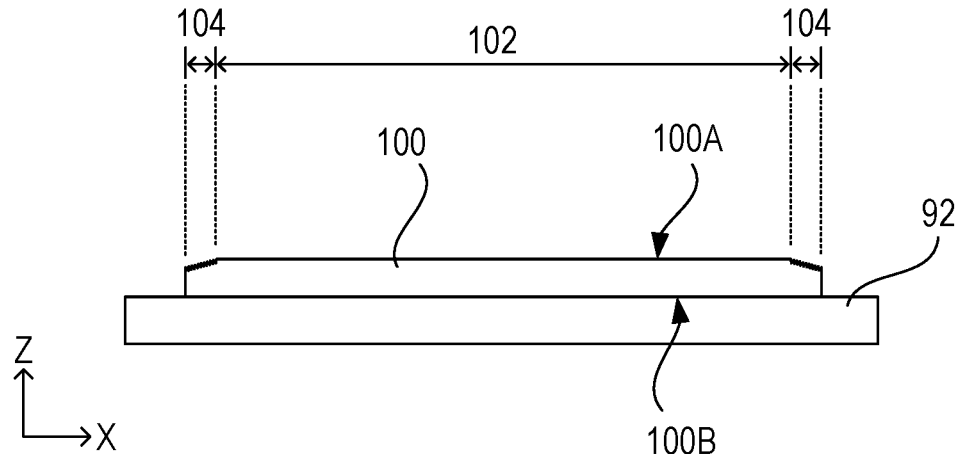
FIG. 2C illustrates a cross-sectional view of a PVD target structure according to some embodiments of the present disclosure.

Referring to FIG. 2C, in other embodiments, the second region 104 on the first side 100A of the target body 100 may have a slope relative to the first region 102. Such slope can be a structure of chamfering. Accordingly, the target body 100 may have an irregular hexagon shape from a cross-sectional view perspective. The slope of the second region 104 may exist prior to the forming of the knurled profile, which means the knurled profile is formed on an inclined plane of the target body 100.

Figure 3:
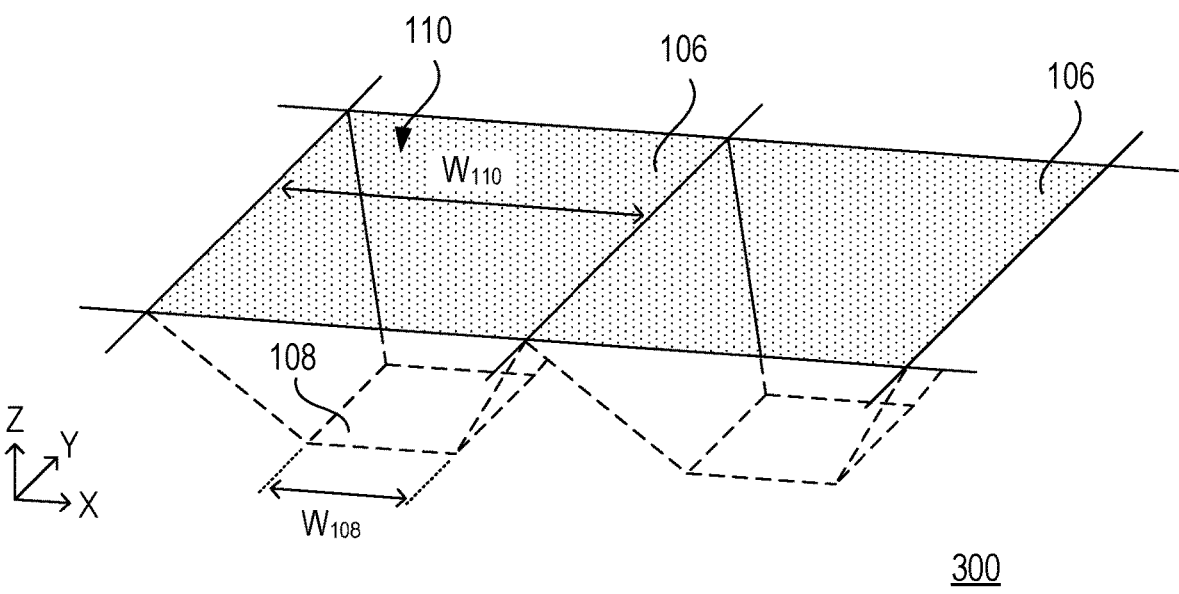
FIG. 3 illustrates a 3D view drawing of a portion of the knurled profile of the target body according to some embodiments of the present disclosure.

Referring to FIG. 3, which illustrates a knurled profile 300 of the target body 100 within the second region 104 according to some embodiments of the present disclosure. In some embodiments, the knurled profile 300 includes a plurality of concave structures 106. In some embodiments, the profile of each of the concave structures 106 are substantially the same. In some embodiments, the concave structures 106 may be adjacent to each other, as shown in FIG. 3. In other embodiments, the concave structures 106 may be separated from each other. In some embodiments, a width $W_{108}$ of a bottom surface 108 of each concave structure 106 is less than a width $W_{100}$ of an opening 110 of each concave structure 106. In some embodiments, the width $W_{108}$ of the bottom surface 108 of each of the concave structures 106 is in a range of from about 0.35 mm to about 0.45 mm. In some embodiments, the width $W_{110}$ of the opening 110 of each of the concave structures 106 is in a range of from about 0.55 mm to about 0.65 mm. In some embodiments, a depth of each of the concave structures 106 is in a range of from about 0.4 mm to about 0.6 mm.

Figure 4:
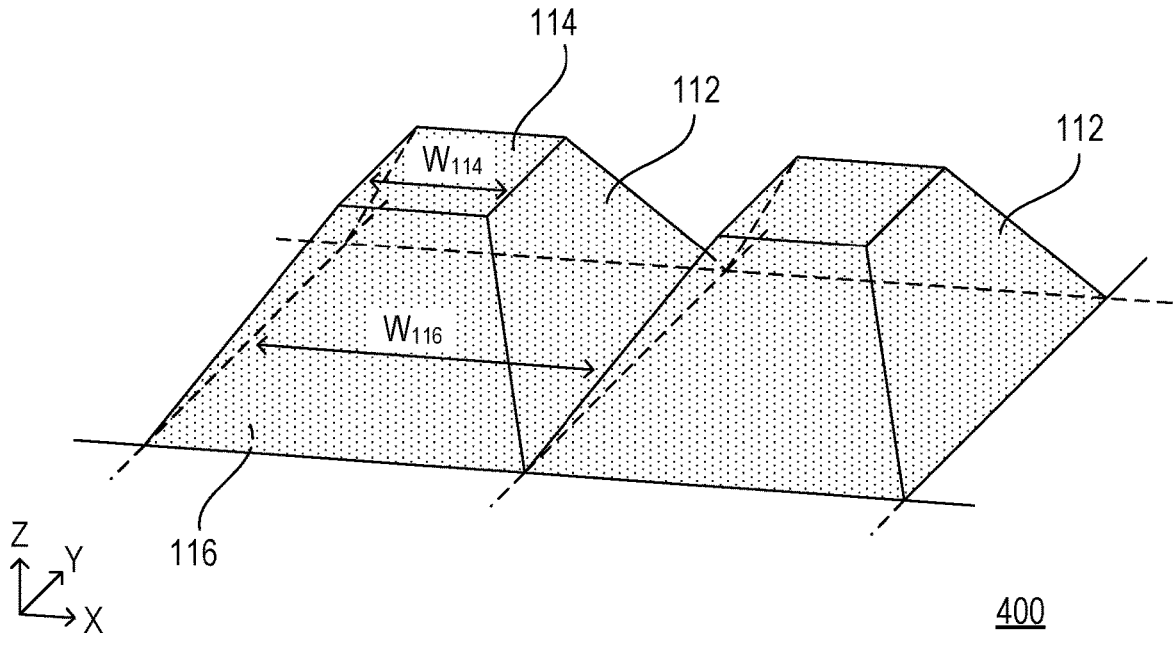
FIG. 4 illustrates a 3D view drawing of a portion of the knurled profile of the target body according to some embodiments of the present disclosure.

Referring to FIG. 4, which illustrates a knurled profile 400 of the target body 100 within the second region 104 according to some embodiments of the present disclosure. In some embodiments, the knurled profile 400 includes a plurality of convex structures 112. In some embodiments, the profile of each of the convex structures 112 are substantially the same. In some embodiments, the convex structures 112 may be adjacent to each other, as shown in FIG. 4. In other embodiments, the convex structures 112 may be separated from each other. In some embodiments, a width $W_{114}$ of a top surface 114 of each convex structure 112 is less than a width $W_{116}$ of a bottom 116 of each convex structure 112. In some embodiments, the width $W_{114}$ of the top surface 114 of each of the convex structures 112 is in a range of from about 0.35 mm to about 0.45 mm. In some embodiments, the width $W_{116}$ of the bottom 116 of each of the convex structures 112 is in a range of from about 0.55 mm to about 0.65 mm. In some embodiments, a height of each of the convex structures 112 is in a range of from about 0.4 mm to about 0.6 mm.

Figure 5:
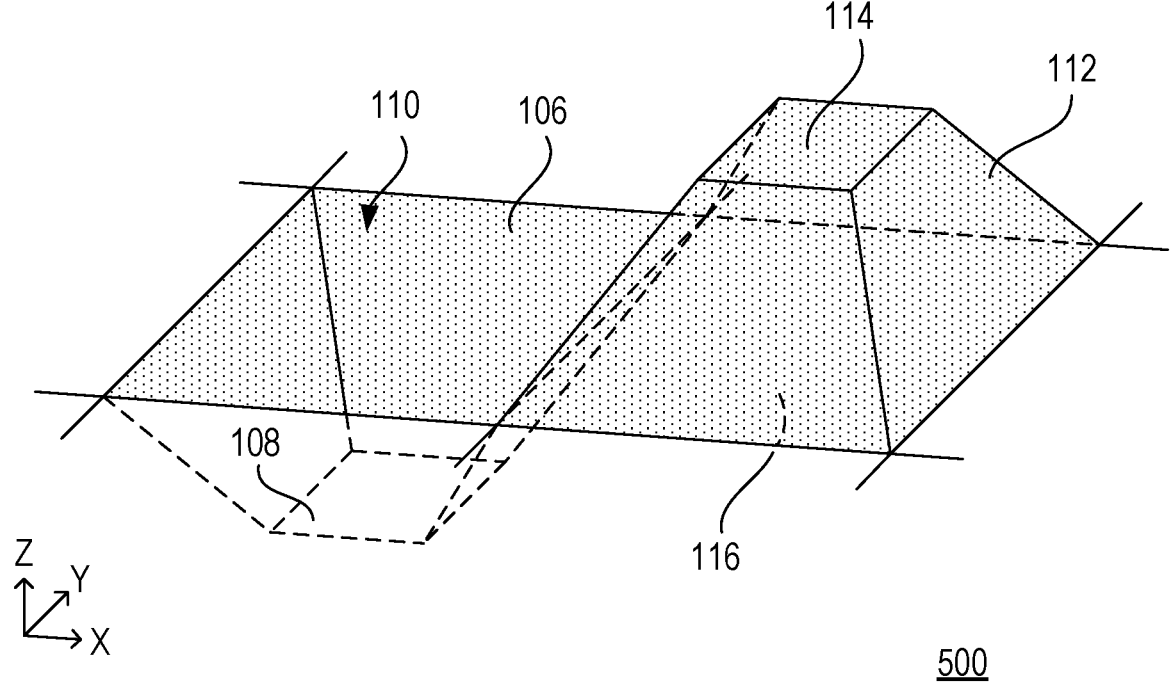
FIG. 5 illustrates a 3D view drawing of a portion of the knurled profile of the target body according to some embodiments of the present disclosure.

Referring to FIG. 5, in some embodiments, a knurled profile 500 in the second region 104 of the first side 100A of the target body 100 can be a combination of the concave structure 106 shown in FIG. 3 and the convex structure 112 shown in FIG. 4, while the concave structure 106 and the convex structure 112 are regularly arranged within the second region 104. For instance, the concave structure 106 and the convex structure 112 can be arranged alternatively along the x-axis and/or the y-axis. Since the knurled profile in the second region 104 is formed based on the manner of knurling, the detail of the knurled profile is rolled from the patterned work piece, and therefore the concave structure 106 and the convex structure 112 should represent the regular pattern from the patterned work piece instead of irregular profile that usually formed by typical carving, sandblasting, or grinding the surface of the target body.

In addition, because the knurled profile in the second region 104 is formed through the manner of knurling, hence the entire surface of the first side 100A of the target body 100 in the second region 104 is still upward exposed to a certain extent at the top view perspective. That is, there are no further concave structures at the inner sides of the concave structure 106 in the knurled profile.

Figure 6:
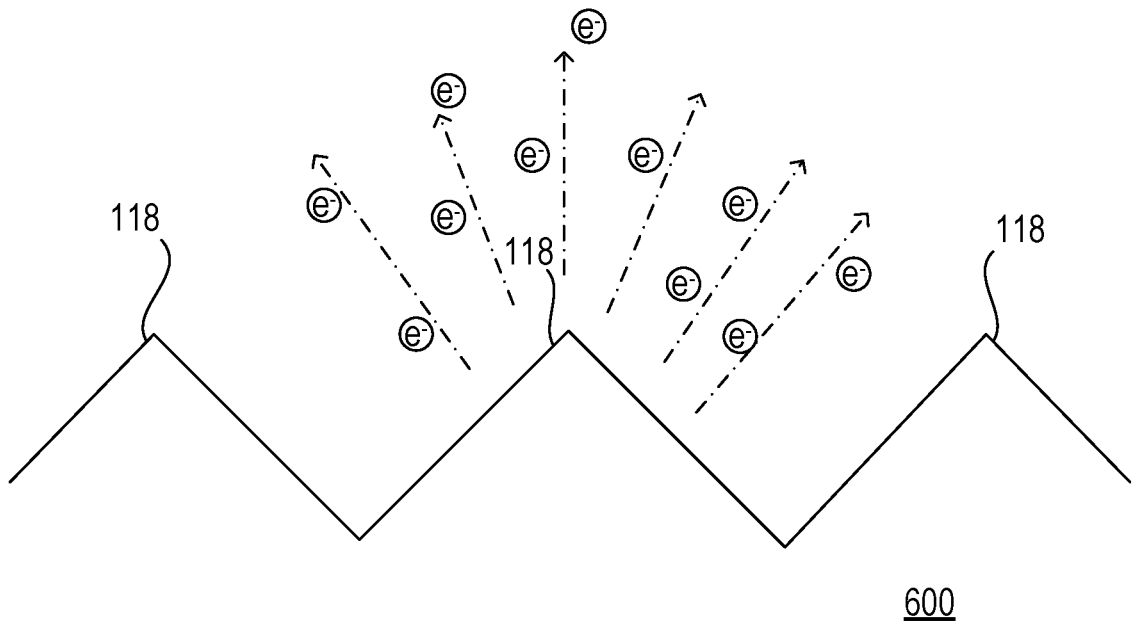
FIG. 6 illustrates a cross-sectional view of a portion of the knurled profile of the target body according to some embodiments of the present disclosure.

Furthermore, regarding the knurled profile disclosed in the present disclosure, the edges and corners in the knurled profile (e.g., provided by the concave structure 106 and/or the convex structure 112) are crucial in the purpose of generating the secondary electrons. FIG. 6 illustrates an example of a portion of the knurled profile 600 from cross-section view perspective. In some embodiments, the knurled profile 600 includes a plurality of pointed structures 118 (or called "peak structures" that having tip-liked structures) from the cross-section view perspective. These pointed structures 118 can achieve an effect akin to point discharge, facilitating the generation of secondary electrons. Point discharge is a phenomenon caused by a strong electric field, typically occurring near sharp objects (such as pointed electrodes) within a gas environment. These occurrences involve the ionization and conductivity of gas molecules, leading to the spread and release of the electric field. When the electric field near the sharp object reaches sufficient strength, it can ionize gas molecules and generate charged particles (ions). These ions, influenced by the electric field, gather around the sharp object, creating a corona region. In other words, as molecules in the gas become ionized and turned into ions accordingly, the gas in that area becomes conductive. This implies that the sharp object is no longer the sole conductor; it forms a larger conductive area together with the surrounding ionized gas. Consequently, the electric field within this expanded conductive region gradually weakens, as the electric field lines shift direction due to changes in the shape of the conductive area. Subsequently, if the electric field strength is sufficiently high, electrons may undergo the point discharge under the influence of the electric field.

In some embodiments of the present disclosure, the knurled profile may be employed as sharp objects for inducing the point discharge effect. In contrast, without such tip-liked structures, the benefits of crafting specialized targets through knurling would be diminished. As the description of the point discharge effect above, the generation of secondary electrons is closely associated with the pointed structures 118 provided by the concave structures 106 or convex structures 112 previously shown in FIGS. 3 and 4. In other words, if the target body 100 is fashioned with non-flat surfaces composed of multiple round-shaped protrusions or indentations, the efficacy of secondary electron generation is lower than that of a target body with a knurled profile featuring pointed structures. The term "pointed structure" (or "peak structures") here is defined as a cross-section view perspective. In a three-dimensional context, it may refer to the angles formed by the intersection of two surfaces.

Figure 7A:
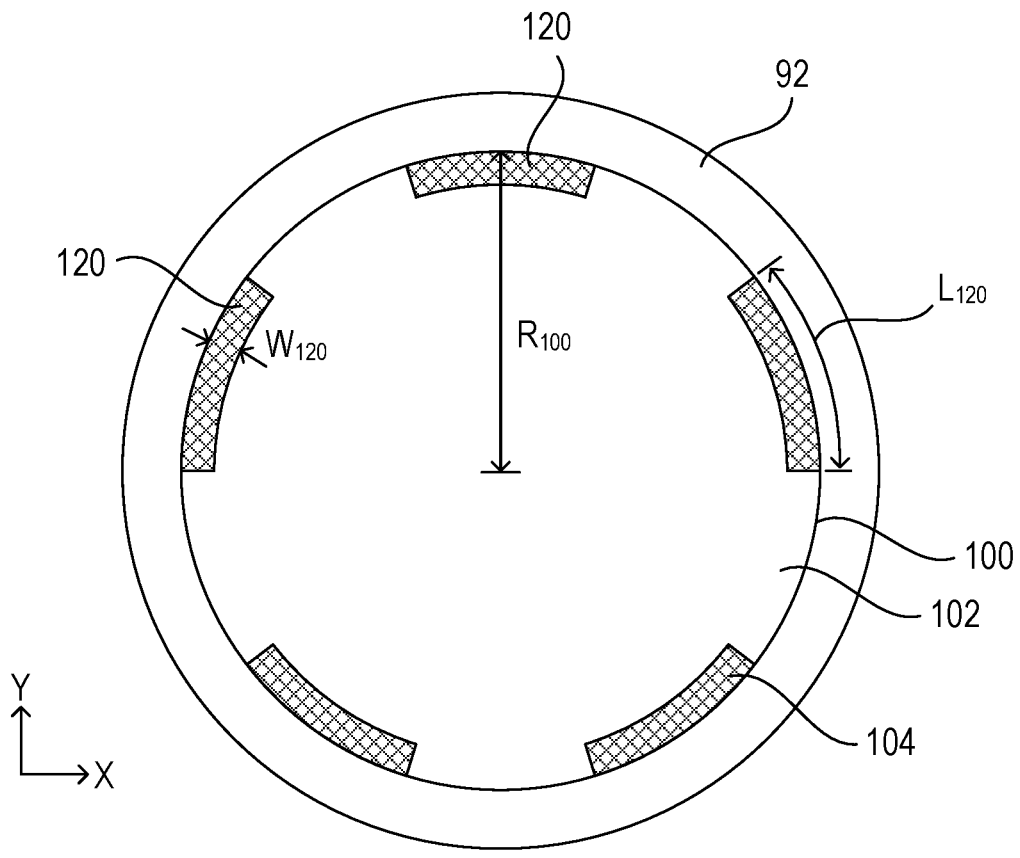
FIG. 7A illustrates a top view of a PVD target structure according to some embodiments of the present disclosure.

Referring to FIGS. 7A to 7E, which illustrates several examples that the shape and the locations of the second region 104 can be altered from the typical application previously shown in FIG. 2A. Referring to FIG. 7A, in some embodiments, the second region 104 on the first side 100A of the target body 100 is an open ring shape having a plurality of separate sections 120. In some embodiments, these sections 120 are distributed evenly to present the ring shape and symmetric to the center of the first side 100A of the target body 100 and/or symmetric to the diameter of the first side 100A of the target body 100. In such embodiments, the width $W_{120}$ of each of the sections 120 is no greater than about 10% of the radius $R_{100}$ of the target body 100. In some embodiments, an arc length $L_{120}$ of each of the sections 120 is the same.

Compared with the embodiment previously shown in FIG. 2A, the total area of the second region 104 shown in FIG. 7A is less than the area of the second region 104 shown in FIG. 2A. The area difference between these second regions 104 may come from the consideration that the quantity of secondary electrons should be controlled to a certain degree to prevent the PVD sputtering process from proceeding too rapidly, which could result in abnormal excessive consumption of the target material. This consideration is particularly important given that the targets utilized in semiconductor processes are usually quite expensive. Therefore, in addition to using a knurled profile to enhance the generation of secondary electrons, adjustments can also be made to the overall area of the knurled profile. This allows for a proper control of the quantity of secondary electrons generated, striking a balance between the rate of the PVD process and the consumption rate of the target material.

Figure 7B:
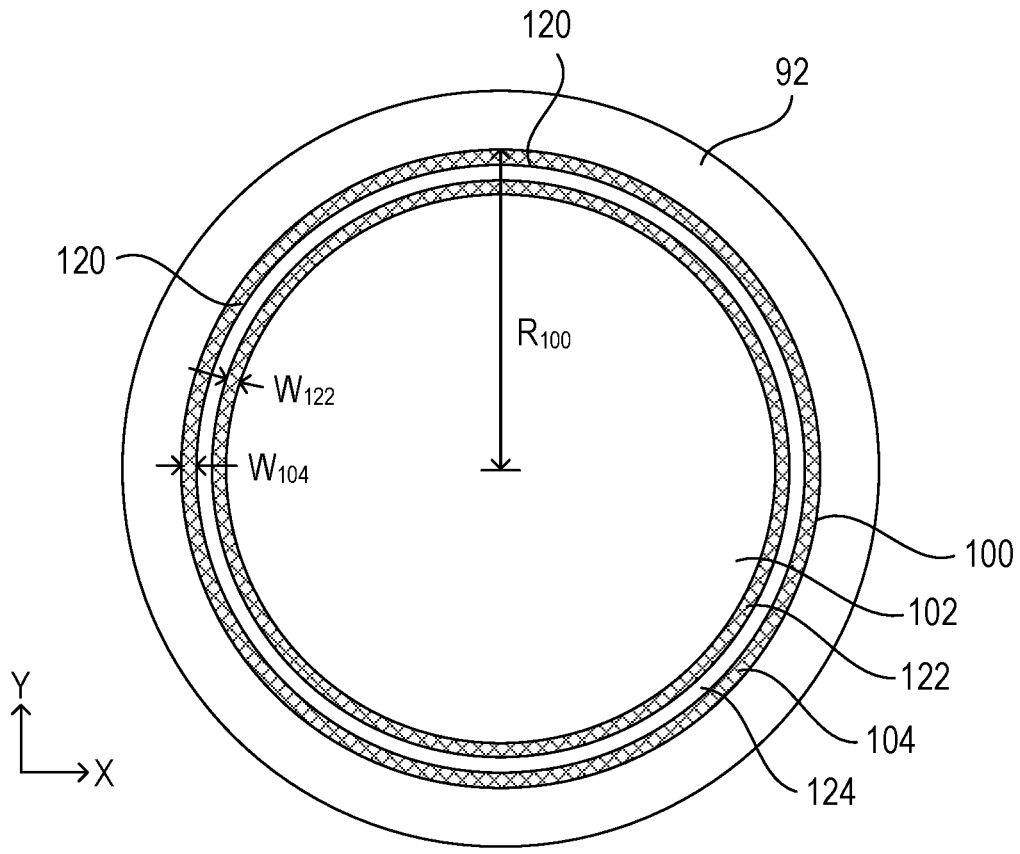
FIG. 7B illustrates a top view of a PVD target structure according to some embodiments of the present disclosure.

Referring to FIG. 7B, in some embodiments, the first side 100A of the target body 100 may further includes a third region 122 surrounded by the second region 104, and a fourth 104 region 124 sandwiched by the second region 104 and the third region 122. In such embodiments, the third region 122 includes the knurled profile. Compared with the embodiment previously shown in FIG. 2A, the embodiment shown in FIG. 7B includes two ring-shaped regions having the knurled profile. In such embodiment, these two ring-shaped regions (i.e., the second region 104 and the third region 122) are concentric. In some embodiments, a combination of the width $W_{104}$ of the second region 104 and a width $W_{122}$ of the third region 122 is no greater than about 10% of the radius $R_{100}$ of the target body 100. In some embodiments, the width $W_{104}$ of the second region 104 and the width $W_{122}$ of the third region 122 are equal. In some embodiments, the width $W_{104}$ of the second region 104 and the width $W_{122}$ of the third region 122 are different from each other.

Figure 7C:
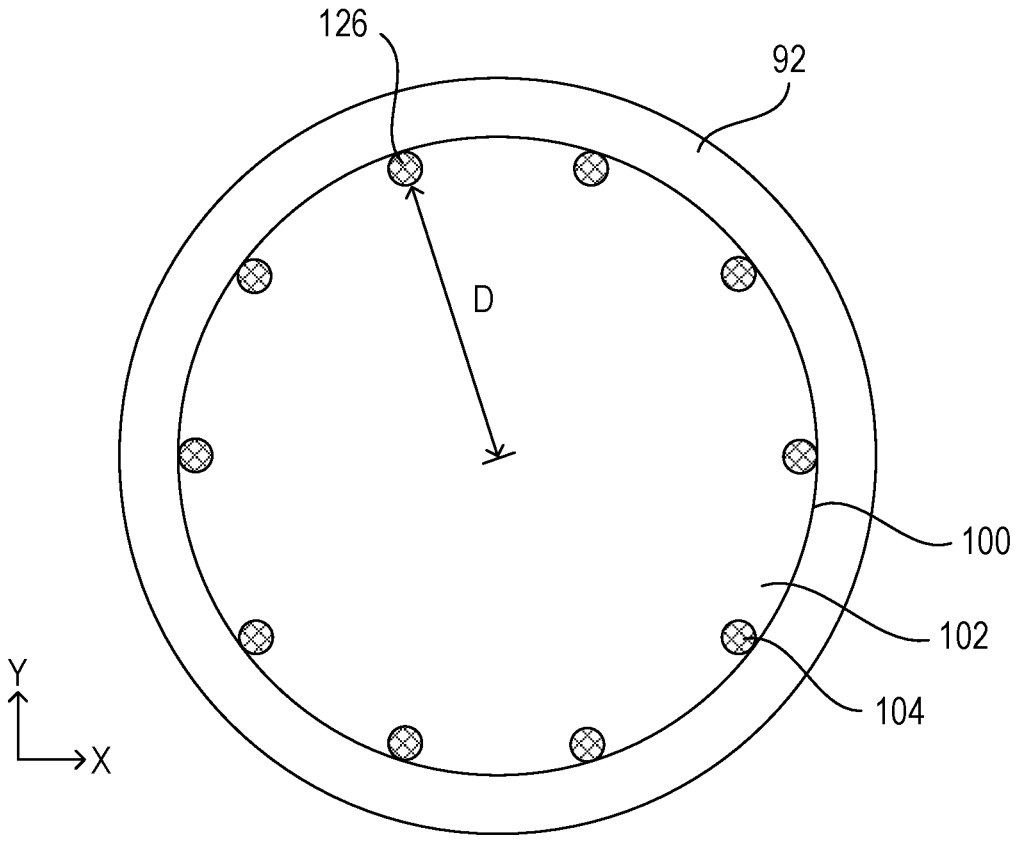
FIG. 7C illustrates a top view of a PVD target structure according to some embodiments of the present disclosure.

Referring to FIG. 7C, in some embodiments, the second region 104 includes a plurality of subregions 126 distributed evenly at the periphery of the first side 100A of the target body 100 and symmetric with respect to the center of the first region 102. The subregions 126 in the embodiment shown in FIG. 7C is similar with the separated sections 120 previously shown in FIG. 7A. In some embodiments, the sections 120 shown in FIG. 7A are related to the original ring-shape as the second region 104 previously shown in FIG. 2A, whereas each of the subregions 126 may have an independent shape.

Figure 7D:
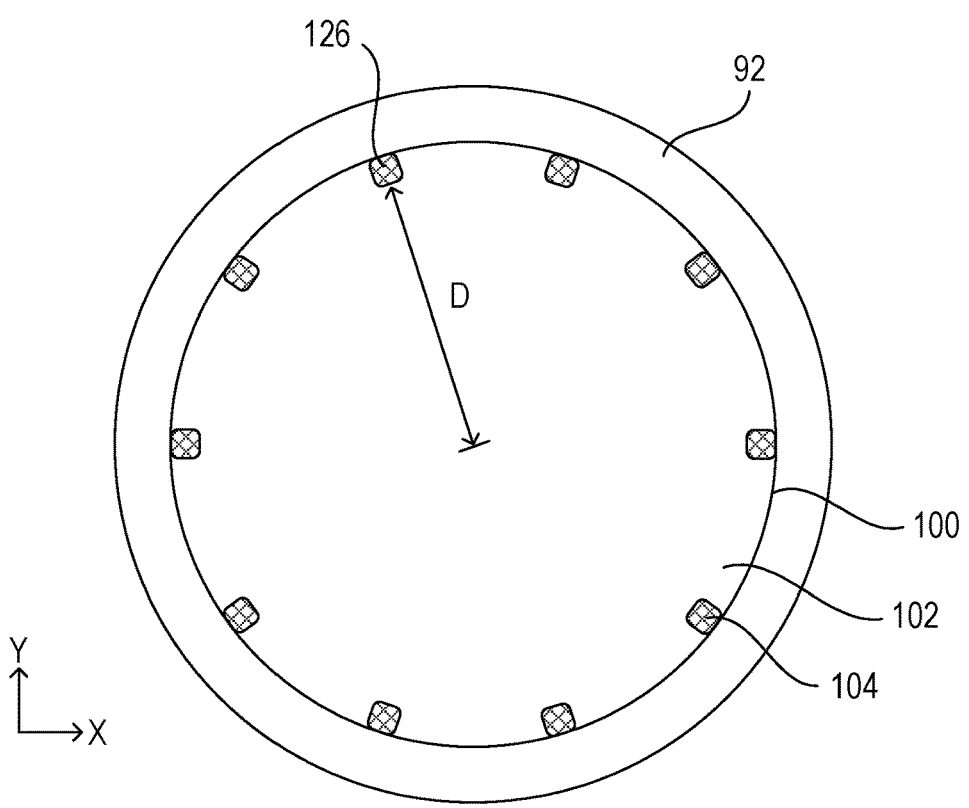
FIG. 7D illustrates a top view of a PVD target structure according to some embodiments of the present disclosure.
Figure 7E:
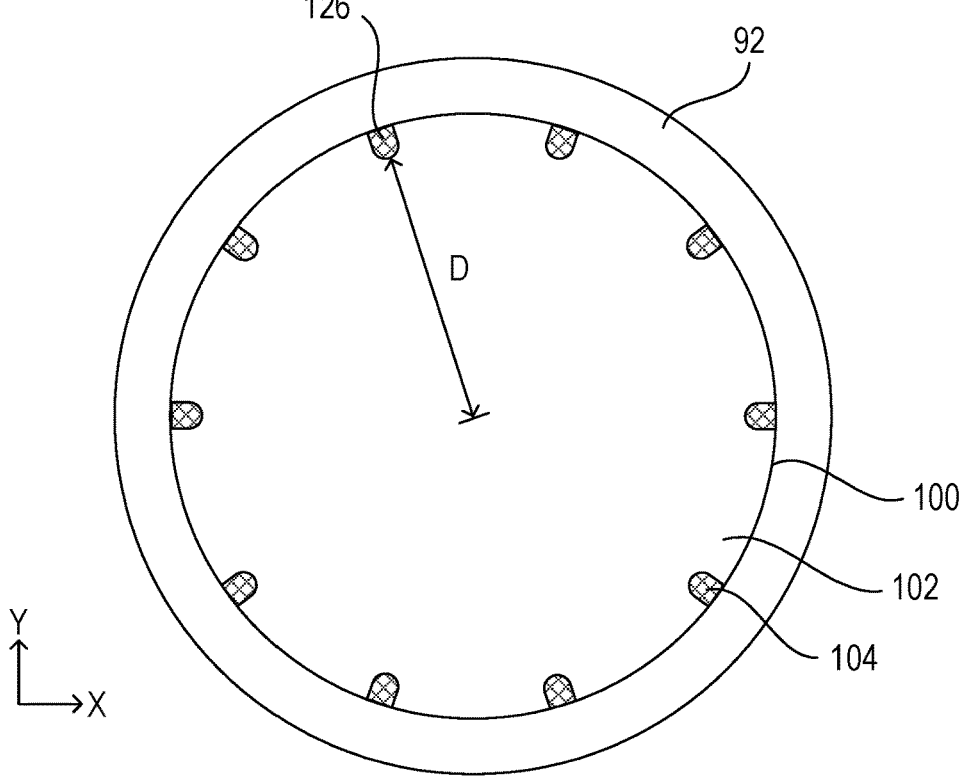
FIG. 7E illustrates a top view of a PVD target structure according to some embodiments of the present disclosure.

Referring to FIGS. 7C, 7D, and 7E, in some embodiments, a shape of each of the subregions 126 is circle, square, or half-oval. In some embodiments, the total area of the subregions 126 is no greater than the area of the second region 104 in the embodiment previously shown in FIG. 2A since the design of the subregions 126 is used to control the generation of the secondary electrons to a certain degree to prevent the PVD sputtering process from proceeding too rapidly. In some embodiments, a distance from the center of the first region 102 to the second region 104 is no less than about 90% of a radius of the target body 100. That is, in the embodiments shown in FIGS. 7C, 7D, and 7E, a distance D from the center of the first region 102 to the each of the subregions 126 is no less than about 90% of a radius of the target body 100. Referring to FIG. 7C, in some embodiments, when the shapes of the subregions 126 are circle, a diameter of each subregion 126 may be equal to each other, but the disclosure is not limited thereto. Referring to FIGS. 7D and 7E, in some embodiments, when the shapes of the subregion 126 are square or hald-oval, a dimension of each subregion 126 may be equal, but the disclosure is not limited thereto.

Figure 8:
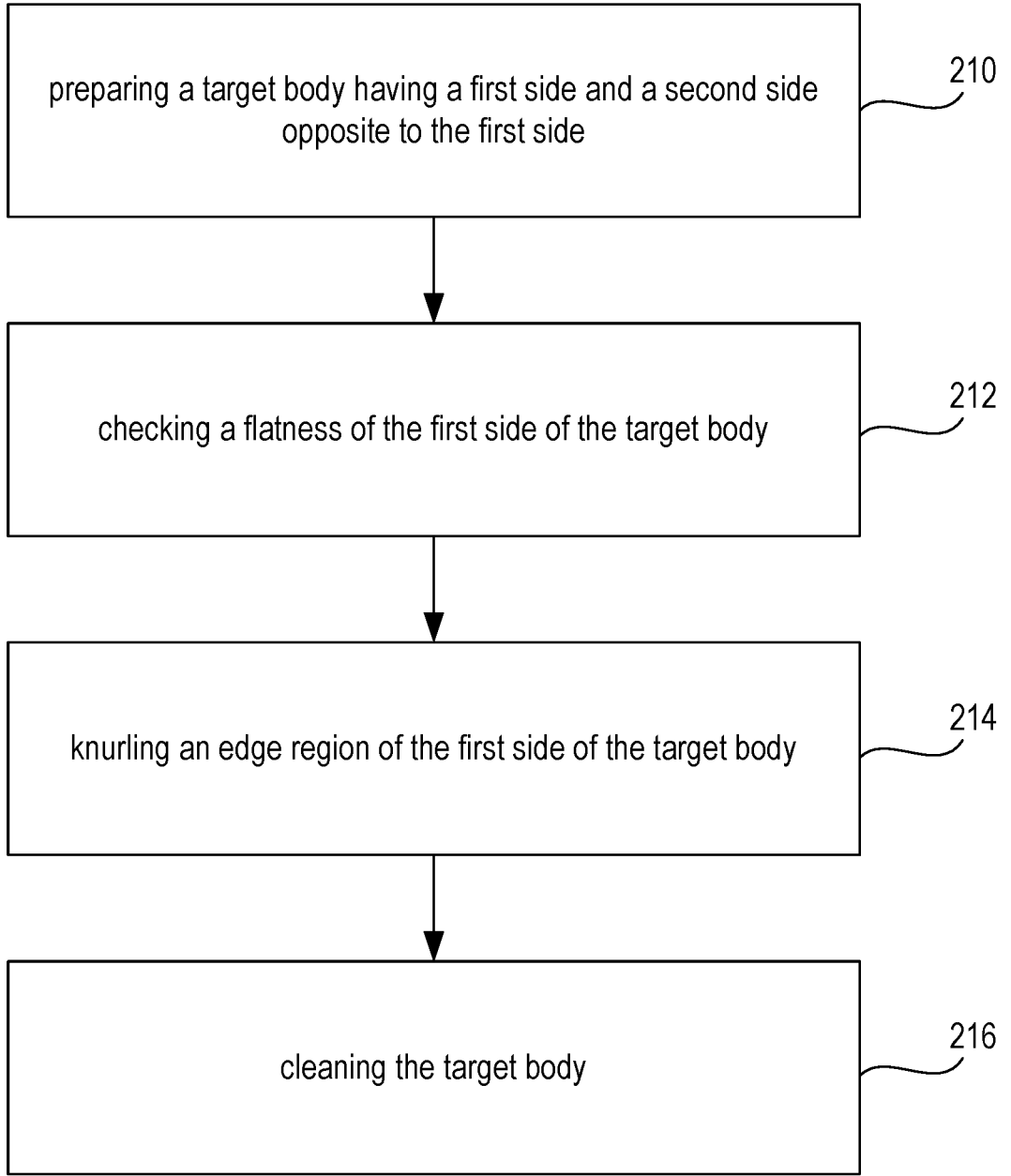
FIG. 8 illustrates a flow chart of preparing PVD target structure according to some embodiments of the present disclosure.

Referring to FIG. 8, in some embodiments, in order to prepare the PVD target structure disclosed in the present disclosure, such method includes the operations that: operation 210: preparing a target body having a first side and a second side opposite to the first side, wherein both the first side and the second side of the target body substantially have plane surfaces; operation 212: checking a flatness of the first side of the target body before knurling an edge region of the first side of the target body; operation 214: knurling an edge region of the first side of the target body to form a knurled profile in the edge region; and operation 216: cleaning the target body. In some embodiments, the knurled PVD target structure will further be inspected to ensure that the knurled profile is formed correctly.

In some embodiments, knurling the edge region of the first side of the target body includes the operation that forming a plurality of concave structures in the edge region of the first side of the target body, wherein a width of a bottom surface of each of the concave structures is in a range of from about 0.35 mm to about 0.45 mm, and a width of an opening of each of the concave structures is in a range of from about 0.55 mm to about 0.65 mm.

In some embodiments, knurling the edge region of the first side of the target body includes the operation that forming a plurality of convex structures in the edge region of the first side of the target body, wherein a width of a bottom of each of the concave structures is in a range of from about 0.55 mm to about 0.65 mm, and a width of a top surface of each of the concave structures is in a range of from about 0.35 mm to about 0.45 mm.

Overall, in preparing the PVD target structure disclosed in the present disclosure, the crucial part is where the position of the knurled region is located and how the structure detail of the knurled profile is. In some embodiments, the knurled region(s) is/are located in proximity to the edge of one side of the target body. In some embodiments, the knurled region can be distributed evenly along the circumference of the target body. In some embodiments, the knurled region can be formed as a plurality of distinct subregions rather than a unified whole. In some embodiments, the total area of the knurled region is determined in accordance with the quantity of secondary electrons generated during the PVD process and must not surpass a predefined threshold. This precaution prevents the PVD sputtering from proceeding too swiftly. In some embodiments, the configuration of the knurled region's shape can be adapted to suit different applications. In some embodiments, the knurled profile in the knurled region may provide a plurality of pointed structures from a cross-section view perspective for effectively generating the secondary electrons. In some embodiments, the knurled profile is composed of a plurality of concave structures. In some embodiments, the knurled profile is composed of a plurality of convex structures. In some embodiments, the knurled profile is composed of a combination of a plurality of concave structures and plurality of convex structures. In some embodiments, a surface roughness of the target body in the knurled region is greater than a surface roughness of the target body in the region without employing the knurling operation. In some embodiments, since the each of the concave structures or each of the convex structures in the knurled region are substantially the same, the knurled profile described in the present disclosure embodies precisely machined structures resulting from the knurling technique, as opposed to a rough surface with randomly distributed microstructures.

According to the embodiments of the present disclosure, the PVD target structure, featuring a knurled region with a distinctive knurled profile, is capable of generating a significant number of secondary electrons during the PVD process. As a result, this innovation effectively mitigates the frequency of plasma ignition failure.

The PVD target structure disclosed in the present disclosure can be employed in the PVD process of manufacturing semiconductor structures, for instance, the process of fabricating the film structures in the RRAM process, MRAM process, etc. In addition, since the PVD target structure disclosed in the present disclosure is an improvement of the target per se, generally, any PVD process can benefit from the novel PVD target structure disclosed in the present disclosure.

In one exemplary aspect, a PVD target structure is provided. The PVD target structure includes a target body having a first side and a second side opposite to the first side. The first side of the target body includes a first region and a second region surrounding the first region. The second region comprises a knurled profile.

In another exemplary aspect, a PVD target structure is provided. The PVD target structure includes a target body having a first side and a second side opposite to the first side. The first side of the target body includes a first region and a second region in proximity to a periphery of the first side of the target body. A surface roughness of the target body in the second region is greater than a surface roughness of the target body in the first region.

In yet another exemplary aspect, a method for preparing PVD target structure is provided. The method includes the following operations. A target body having a first side and a second side opposite to the first side is received. An edge region of the first side of the target body is knurled to form a knurled profile in the edge region.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition (PVD) target structure, comprising:
   a planar target body, having a first side and a second side opposite to the first side, with a sidewall intersecting the first side and the second side, the sidewall extending along a first direction, the first side is consisting of:
   a first region; and
   a second region substantially parallel to the first region, the second region is adjacent to the sidewall and surrounds the first region, wherein the second region is consisting of a knurled profile, and the second region extends along a second direction perpendicular to the first direction,
   wherein the knurled profile comprises a plurality of concave structures and a plurality of convex structures arranged alternately along the second direction, and wherein each concave structure has a shape of an inverted frustum of a pyramid, and each convex structure has a shape of a frustum of a pyramid.

2. The PVD target structure of claim 1, wherein the second region comprises a ring shape.

3. The PVD target structure of claim 2, wherein a width of the second region is equal to or less than about 10% of a radius of the planar target body.

4. The PVD target structure of claim 1, wherein a width of a bottom surface of each of the concave structures is in a range of from about 0.35 mm to about 0.45 mm.

5. The PVD target structure of claim 4, wherein a depth of each of the concave structures is in a range of from about 0.4 mm to about 0.6 mm.

6. The PVD target structure of claim 1, wherein a width of a bottom of each of the convex structures is in a range of from about 0.55 mm to about 0.65 mm.

7. A method for preparing physical vapor deposition (PVD) target structure, the method comprising:
   receiving a target body having a first planar side and a second planar side opposite to the first planar side, with a sidewall intersecting the first planar side and the second planar side, the sidewall extending along a first direction; and
   knurling an edge region of the first planar side of the target body to form a knurled profile in the edge region, wherein the edge region extends along a second direction perpendicular to the first direction, and the knurled profile is adjacent to the sidewall of the target body,
   wherein knurling the edge region of the first planar side of the target body comprises:
   forming a plurality of concave structures and a plurality of convex structures in the edge region of the first planar side of the target body, the plurality of concave structures and the plurality of convex structures arranged alternately, and wherein each concave structure has a shape of an inverted frustum of a pyramid, and each convex structure has a shape of a frustum of a pyramid.

8. The method of claim 7,
   wherein a width of a bottom surface of each of the concave structures is in a range of from about 0.35 mm to about 0.45 mm, and a width of an opening of each of the concave structures is in a range of from about 0.55 mm to about 0.65 mm.

9. The method of claim 7, wherein a width of a bottom of each of the concave structures is in a range of from about 0.55 mm to about 0.65 mm, and a width of a top surface of each of the concave structures is in a range of from about 0.35 mm to about 0.45 mm.

10. The PVD target structure of claim 1, wherein the sidewall of the planar target body is substantially perpendicular to the first side of the planar target body.

11. The PVD target structure of claim 1, wherein a surface of the second region of the first side of the planar target body is substantially parallel to the second side of the of the planar target body.

12. A method for performing a physical vapor deposition process, the method comprising:

installing a planar PVD target structure in a PVD chamber, the planar PVD target structure comprises a first side and a second side opposite to the first side, with a sidewall intersecting the first side and the second side, the sidewall extending along a first direction, the first side is consisting of a first region and a second region substantially parallel to the first region, the second region is adjacent to the sidewall and surrounds the first region, wherein the second region comprises one or more knurled profiles adjacent to the sidewall, and the second region extends along a second direction perpendicular to the first direction; and positioning a substrate in the PVD chamber, the substrate has an upper surface facing the first side of the planar PVD target structure, wherein the knurled profile of the second region of the planar PVD target structure projects over a region outside the substrate.

13. The method of claim 12, wherein the knurled profiles are distributed evenly at a periphery of the first side of the planar PVD target structure and symmetric with respect to a center of the first region.

14. The method of claim 13, wherein a shape of each of the knurled profiles is circle, square, or half-oval.

15. The PVD target structure of claim 1, wherein a bottom surface of each concave structure in the second region is substantially parallel to a surface of the first side.

16. The PVD target structure of claim 1, wherein each concave structure at least right next to one of the convex structures.

17. The PVD target structure of claim 1, wherein a sidewall of the concave structure is connected to a sidewall of the convex structure.

18. The method of claim 7, wherein knurling an edge region of the first planar side of the target body is performed by sandblasting the first planar side of the target body.

19. The method of claim 7, wherein a top surface of each convex structure is substantially parallel to a surface of the first planar side of the target body.

20. The method of claim 7, wherein a height of each convex structure is in a range from about 0.4 mm to about 0.6 mm, and a depth of each concave structure is in a range from about 0.4 mm to about 0.6 mm.

*     *     *     *     *